United States Patent [19]

Hwang

[11] Patent Number: 5,445,982
[45] Date of Patent: Aug. 29, 1995

[54] METHOD OF FABRICATING NONVOLATILE SEMICONDUCTOR MEMORY DEVICE

[75] Inventor: Hyun S. Hwang, Seoul, Rep. of Korea

[73] Assignee: Goldstar Electron Co., Ltd., Rep. of Korea

[21] Appl. No.: 214,975

[22] Filed: Mar. 17, 1994

[30] Foreign Application Priority Data

Feb. 23, 1994 [KR] Rep. of Korea ............... 3198/1994

[51] Int. Cl.$^6$ ................ H01L 21/8247; H01L 21/205
[52] U.S. Cl. ....................................... 437/43; 437/233
[58] Field of Search ............... 437/43, 49, 233, 48, 437/52

[56] References Cited

U.S. PATENT DOCUMENTS 5,147,813  9/1992  Woo .
5,350,698  9/1994  Huang et al. ............... 437/26

Primary Examiner—Olik Chaudhuri
Assistant Examiner—Richard A. Booth
Attorney, Agent, or Firm—Poms, Smith, Lande & Rose

[57] ABSTRACT

A method of fabricating a nonvolatile semiconductor memory device so as to improve interface properties between a tunneling oxide layer and a floating gate of the nonvolatile semiconductor memory device is disclosed, wherein the method comprises the steps of forming a tunneling oxide layer on a substrate, forming a floating gate consisting of a plurality of thin silicon layers which are formed through the repeated cyclical process under the low temperature of around 550 degrees C., forming an interposed insulating layer over a whole surface of the floating gate by a selective etching process of the silicon layers; and forming a control gate over a whole surface of the interposed insulating layer.

6 Claims, 5 Drawing Sheets

FIG. I
PRIOR ART
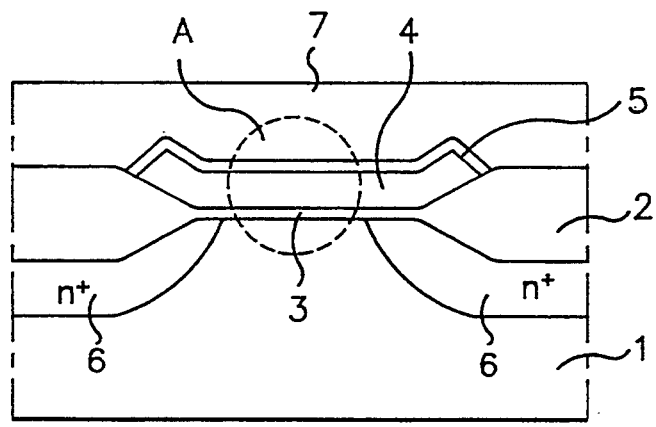
FIG. 2
PRIOR ART
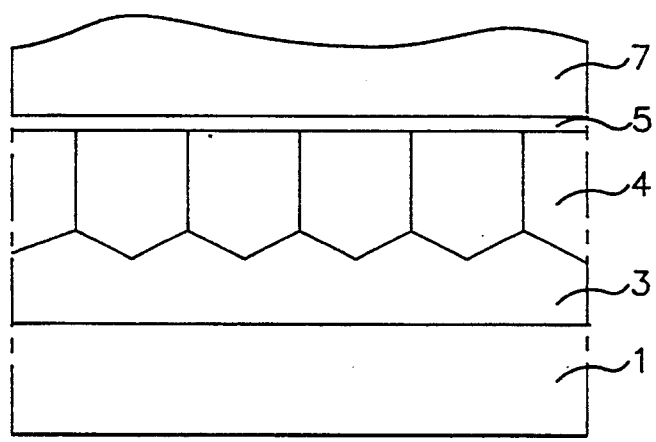

METHOD OF FABRICATING NONVOLATILE SEMICONDUCTOR MEMORY DEVICE

FIELD OF THE INVENTION

This invention relates to a method of fabricating a nonvolatile semiconductor memory device, more particularly to a method a floating gate of the nonvolatile semiconductor memory device.

BACKGROUND OF THE INVENTION

Each memory cell of Electrically programmable read only memory (EPROM) which is representative of the nonvolatile memory devices is, as shown in FIG. 1, characterized by a floating gate 4 which is separated by a layer of insulating material (commonly called tunneling oxide layer) disposed on a channel area between a source area 6 and a drain area 6 in a semiconductor substrate 1, and a control gate 7 formed on an insulating layer 5 which is interposed between both the gates 4 and 7.

A high positive voltage applied to the control gate and drain of such an electrically erasable programmable read only memory (EEPROM) cell causes hot electrons in the vicinity of the drain to be generated and these electrons have enough energy to pass over the potential energy barrier of the tunneling oxide layer and charge the floating gate.

The stored charges in the floating gate alter the threshold voltage of the cell transistor and then the cell is programmed.

Also, the read operation of the memory cell is made by applying specific voltage to each of the source and drain area and the control gate, and sensing the current which flows between the source and the drain.

Initially, EPROMs required UV light for erasing, but now it is possible to erase the contents of a ROM electrically, which is called EEPROM.

The erasing of the initially developed EEPROM cell was done by providing specific voltage to each of the source and drain area and the control gate, and thereby transporting, the charges stored in the floating gate into the drain area.

Recently, there is provided EEPROM cell having an erasure gate so as a third gate separated from the floating and control gate so as to erase the content of the cell.

In a nonvolatile memory cell as described above, the interface surface between the floating gate and the tunneling oxide layer should be not roughened so as to maintain a constant threshold voltage during the erasing.

Further it needs to improve the reliability of the device by reducing the leakage of the tunneling oxide layer due to the stress.

Generally, the floating gate is fabricated out of polysilicon and the grain size of the floating gate made of the polysilicon is around the thickness itself in a thickness of about 2000 angstroms, resulting in a severe roughness of the interface surface.

Accordingly, the floating gate having the finely formed grains has the surface of the mitigated roughness, to improve the reliability of the device.

The recently proposed EEPROM device has the tunneling oxide layer having the thickness of below 100 angstroms, the floating gate having a thickness in the range of about 2000 to 3000 angstroms and an oxide-nitride-oxide (ONO) layer adopted as an interposed insulating layer which is interposed between the floating gate and the control gate.

One of the problems in such a configured nonvolatile memory device is the roughness of the interface surface between the tunneling oxide layer and the floating gate.

The surface between the tunneling oxide layer and monocrystalline silicon layer as the substrate is not rough due to the monocrystalline silicon layer, whereas the surface between the tunneling oxide layer and floating gate is rough due to the grains of the floating gate.

FIG. 2 is an enlarged view of a portion indicated as A in FIG. 1, in which A portion is an interface portion between the floating gate and the tunneling oxide layer.

It is shown that the in case that the floating gate is fabricated out of polysilicon, the rugged interface is formed between the floating gate and tunneling oxide layer.

Such a rugged surface makes the erasure property of each cell inconsistent and the leakage of tunneling oxide layer is generated due to the stress which stems from the bi-directional erasing and programming of the cell by Fowler-Nordheim tunneling method.

Therefore, there has been proposed the methods for improving the reliability of the memory device through the improvement of the interface between the floating gate and the tunneling oxide layer.

S. Aritome discloses a technique for remarkably decreasing the leakage of the oxide layer due to the stress through the embodiment of the improved roughness of the surface which is accomplished by an ion implant with low concentration and a rapid thermal processing at low temperature, in "A reliable tunnel oxide for Flash for FLASH EEPROM", IEDM 1993.

Meanwhile, to solve the problem that it is difficult to obtain a smaller grains in case that the floating gate is made of the polysilicon, the technique is disclosed in U.S. Pat. No. 5,147,813 of which details is simply described below with reference to FIG. 3 and FIG. 4.

As shown in FIG. 3, a floating gate 4 of triple layers is formed b patterning a first, second and third layer formed over the tunneling oxide layer 3 on the substrate 1, each of which corresponds to a thin polysilicon layer 4a having a thickness of 300 to 500 angstroms, an oxide layer 4b having a thickness of 20 to 30 angstroms and a polysilicon layer 4c having a thickness of 1000 to 1500 angstroms, respectively.

FIG. 4 is an enlarged view of a portion indicated as A in FIG. 3. In the figure, it is shown that, as described above, the first layer or thin polysilicon layer 4a of 300 to 500 angstroms makes the grain of polysilicon layer small. The oxide layer 4b as second layer prevents the grain growth of the first layer made of polysilicon.

As described above, the triple layered floating gate has a very thin first layer adjacent to the tunneling oxide layer, which first layer is made of polysilicon of small grains, thereby to mitigate the roughness of the interface between the tunneling oxide layer 3 and the floating gate 4.

However, the above described technique has a severe problem that if the layer 4b as the second layer is too thin, the polysilicon grains become large, and if the layer 4b is too thick, the layer acts as an interposed insulating layer between the first layer and the third layer and as a result, the floating gate does not exhibit the inherent functioning as the floating gate.

SUMMARY OF THE INVENTION

The object of this invention is to improve the reliability of EEPROM cell by minimizing the grain size of the floating gate in order to improve the roughness of the surface between the tunneling oxide layer and the floating gate of the nonvolatile memory device.

In order to accomplish the object of the invention, a method of fabricating a nonvolatile semiconductor memory device comprises the steps of forming a tunneling oxide layer on a substrate; and forming a floating gate consisting of a plurality of thin silicon layers which are formed through the repeated cyclical process under the low temperature of around 550 degrees C.

Here, a plurality of thin silicon layers are formed through the repetition of one cycle process which includes the steps of first depositing of the silicon layer to the thickness of 100 to 500 angstroms at the temperature of about 550 degrees C. and then purging using N2.

BRIEF DESCRIPTION OF THE DRAWINGS

FIG. 1 is a sectional view of conventional EEPROM cell.

FIG. 2 is an enlarged view of a portion indicated as a circle A in FIG. 1.

DETAILED DESCRIPTION OF THE INVENTION

Figure 3:
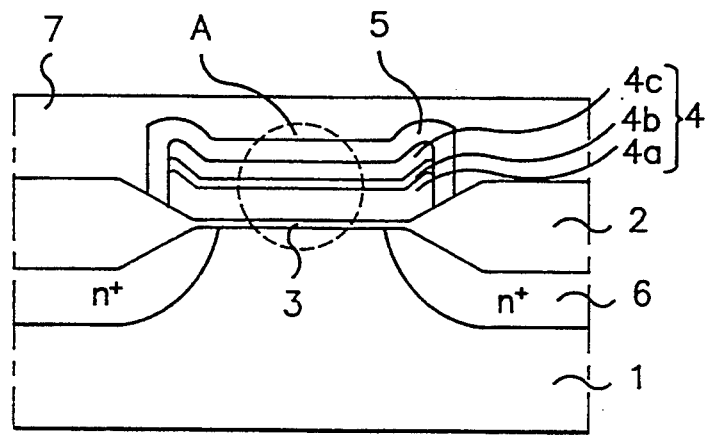
FIG. 3 is a sectional view of conventional EEPROM cell.
Figure 4:
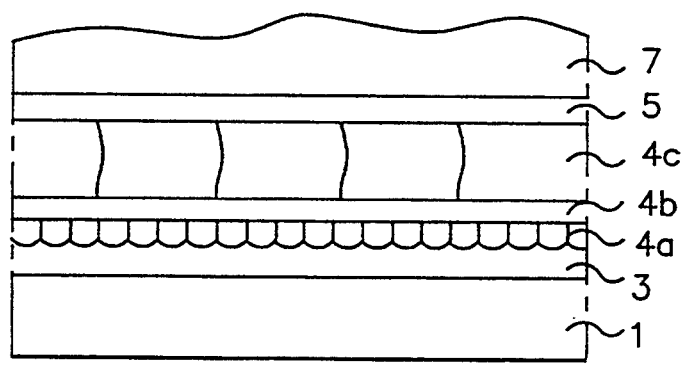
FIG. 4 is partially enlarged view of FIG. 3.
Figure 5:
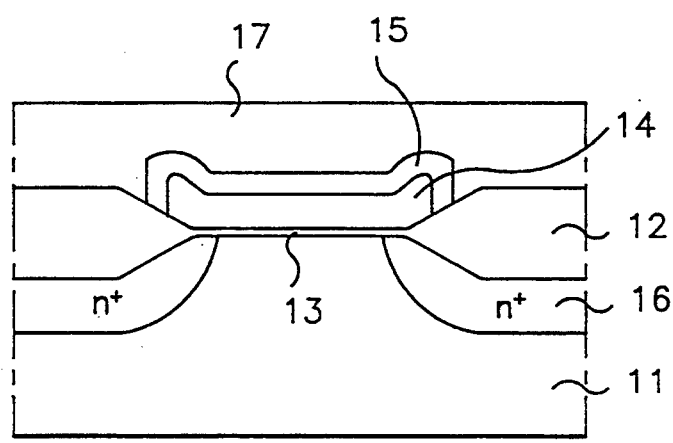
FIG. 5 is a sectional view of EEPROM cell in a preferred embodiment according to this invention.

FIG. 5 is a sectional view of the nonvolatile memory device in a preferred embodiment.

According to an embodiment of this invention, a nonvolatile memory cell includes a substrate 11 having an isolation oxide film and an active area defined by the isolation oxide film, a tunneling oxide layer 13 on the substrate, a floating gate 14 on the tunneling oxide layer 13, and a control gate 17 on an interposed insulating layer 15 between both the gates 14, 17. In the figure, reference numeral 16 denotes a source and drain area.

Figure 6:
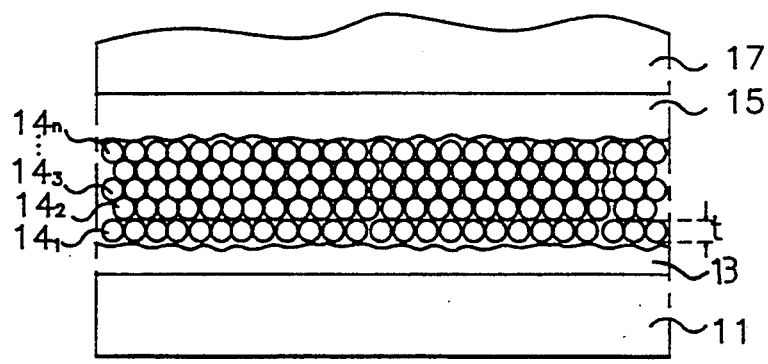
FIG. 6 is partially enlarged view of FIG. 5.

Referring to FIG. 6 which is an enlarged view of a portion as depicted by the circle A in FIG. 5, it is shown that a floating gate of the nonvolatile memory cell has a plurality of the very thin amorphous silicon layers 141,142,143, . . . , 14n which cause to form the fine grains of which average size is in the range of 100 to 500 angstroms, resulting in an improvement of the roughness of an interface surface between the tunneling oxide layer 13 and the floating gate 14. A method of making EEPROM in a preferred embodiment is described below with reference to FIG. 7.

Figure 7A:
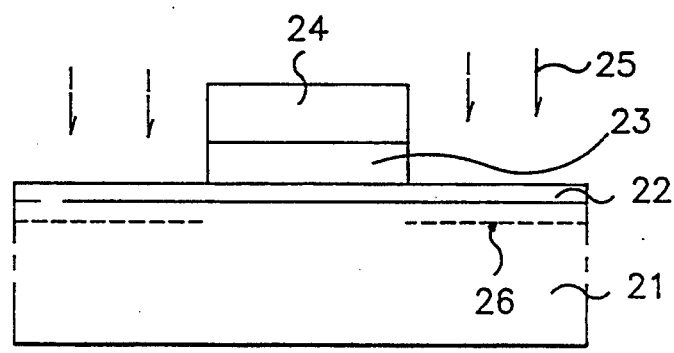
FIGS. 7A to 7F are sectional views of the process steps explaining the method of fabricating EEPROM cell according to this invention.

As shown in FIG. 7A, over a substrate 11 is formed a pad oxide layer 22 on which a silicon nitride layer 23 is formed. A photoresist film is coated over the silicon nitride layer 23 and patterned to prepare an active area pattern 24 through the exposure and development by photolithography process. With the photoresist pattern 24 as a mask, the silicon nitride layer 23 is etched away and the resultant structure is subjected to ion implant with n type impurity, for example, As into the substrate so as to form a source and drain area, thereby to leave n type impurity region 26 in the substrate.

Figure 7B:
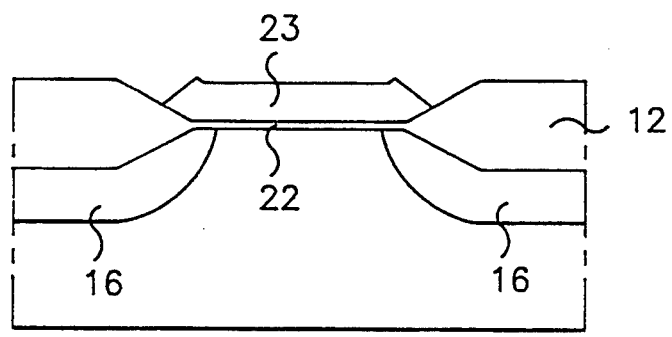

Upon removal of photoresist pattern 24, as shown in FIG. 7B, a field oxide film 12 is formed over a defined isolation area through the thermal oxidation process, wherein said thermal process causes to diffuse out impurity ions in the n type impurity region so that n type source and drain area 16 is formed.

Figure 7C:
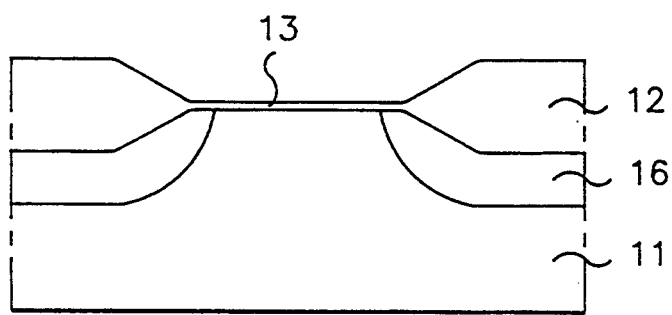

As shown in FIG. 7C, the silicon nitride layer 23 is removed and a thin tunneling oxide layer 13 is formed over the whole surface of the substrate.

Figure 7D:
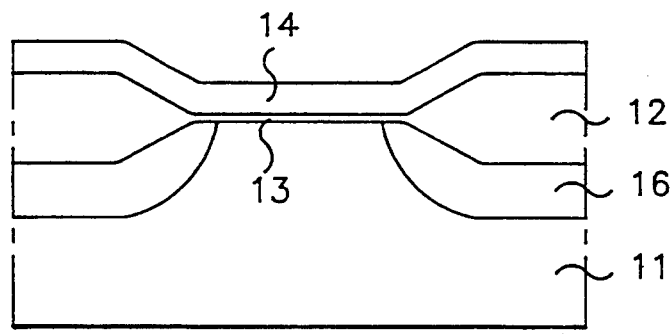

Next, as shown in FIG. 7D, after the deposition of an amorphous silicon layer in a thickness of 100 to 500 angstroms at the temperature of about 550 degrees C., the purging cycle using N2 gas is repeatedly carried out, for example, 4 to 10 cycles to form a silicon layer 14 having a overall thickness of 1500 to 2000 angstroms.

Figure 7E:
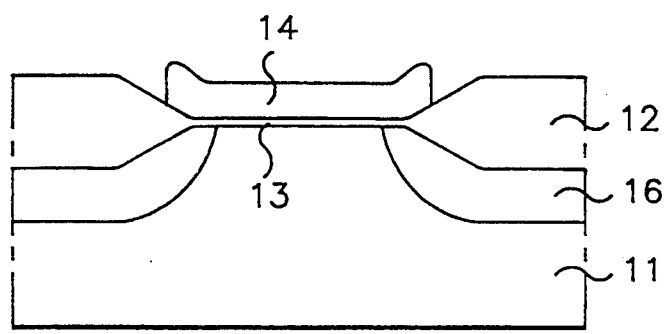

The silicon layer 14 is patterned to form a floating gate 14, as shown in FIG. 7E.

Figure 7F:
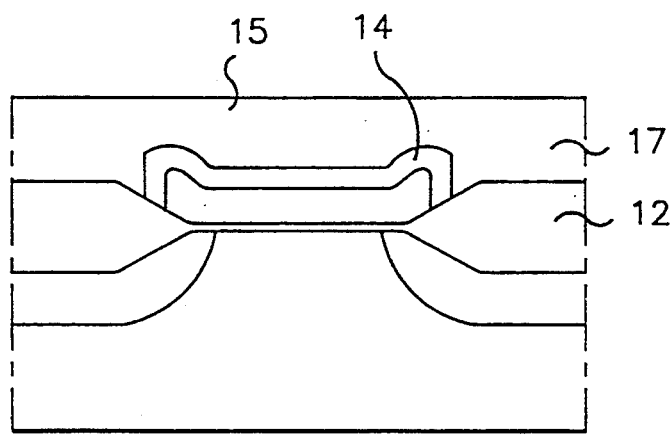

With reference to FIG. 7F, a interposed insulating layer 15 such as an ONO layer is formed on the entire surface of the floating gate 14 and then a conductive material such as polysilicon is deposited on the whole surface of the substrate having the interposed insulating layer 15 so as to form a control gate 17 through the photolithography process, thereby completing EEPROM cell.

According to the present invention as described above, the maximum grain size in the range of about 100 to 500 angstroms can be achieved by the deposition of a plurality of very thin silicon layers as the floating gate through the repeated cyclical process.

Accordingly, it is possible to minimize the roughness of the interface surface between the tunneling oxide layer and the floating gate, thereby removing the phenomenon that the eclectic field is concentrated towards a certain site.

Therefore, it is improved the leakage characteristics of the tunneling oxide layer due to the generated stress during the repeated F-N tunneling operation, thereby extending the lifetime of the device, as well as the maintenance property of a constant threshold voltage even during the erasing. That is, it can be obtained the improved reliability and superior performance of the device.

Even in case that the device of this invention is applied to PMOS device operated at a negative g,ate voltage, it is advantageously improved the interface properties between the floating gate and the tunneling oxide layer under the high eclectic fields, so that the lifetime of the device is further longer.

What is claimed is:

1. A method of fabricating a nonvolatile semiconductor memory device, comprising the steps of:
    forming a tunneling oxide layer on a substrate; and
    forming a floating gate comprising a plurality of silicon layers which are formed through a repeated cyclical process under temperatures of around 550 degrees C.;
    wherein the plurality of silicon layers are formed by repeating a process which includes the steps of depositing a silicon layer with a thickness of 100 to 500 Angstroms at temperatures of about 550 degrees C. and then purging using $N_2$.

2. The method of claim 1, wherein the silicon layers have an overall thickness of 1500 to 2000 Angstroms.

3. A method of fabricating a nonvolatile semiconductor memory device, comprising the steps of:

forming a tunneling oxide layer on a substrate;

forming a floating gate comprising a plurality of silicon layers which are formed through a repeated cyclical process under temperatures of around 550 degrees C.;

forming an interposed insulating layer over the entire surface of the floating gate; and forming a control gate over the entire surface of the interposed insulating layer;

wherein the plurality of silicon layers are formed by repeating a process which includes the step of depositing a silicon layer with a thickness of 100 to 500 Angstroms at temperatures of about 550 degrees C. and then purging using $N_2$.

4. The method of claim 3, wherein the silicon layers have an overall thickness of about 1500 to 2000 Angstroms.

5. The method of claim 4, wherein the interposed insulating layer is made of oxide-nitride-oxide.

6. The method of claim 3, wherein the interposed insulating layer is made of oxide-nitride-oxide.

* * * * *